United States Patent [19]

Mariner

[11] Patent Number: 5,395,180
[45] Date of Patent: Mar. 7, 1995

[54] BORON NITRIDE VAPORIZATION VESSEL

[75] Inventor: John T. Mariner, Avon Lake, Ohio

[73] Assignee: Advanced Ceramics Corporation, Lakewood, Ohio

[21] Appl. No.: 166,470

[22] Filed: Dec. 14, 1993

[51] Int. Cl.⁶ ............................................. C23C 14/26
[52] U.S. Cl. ..................................... 392/389; 118/726
[58] Field of Search ................ 392/388, 389; 118/726, 118/727; 432/262, 264, 265

[56] References Cited

U.S. PATENT DOCUMENTS

| | | | |
|---|---|---|---|
| 3,372,671 | 3/1968 | Chu | 392/388 |
| 3,984,088 | 10/1976 | Sommerkamp | 118/726 |
| 4,023,523 | 5/1977 | Ing | 118/726 |
| 4,043,748 | 8/1977 | Watanabe | 118/726 |
| 4,356,152 | 10/1982 | Berkman | 392/389 |
| 4,747,774 | 5/1988 | Piotrowski | 392/389 |
| 4,811,691 | 3/1989 | McJilton | 118/726 |

Primary Examiner—Teresa J. Walberg
Attorney, Agent, or Firm—Michael N. Meller; Eugene Lieberstein

[57] ABSTRACT

The vaporization vessel includes a body of substantially rectangular configuration having an upper relatively flat surface and a recessed cavity formed in the body with said cavity having a lateral cross sectional geometry which forms an included angle at the intersection with said substantially flat upper surface of greater than 120 degrees.

7 Claims, 1 Drawing Sheet

BORON NITRIDE VAPORIZATION VESSEL

FIELD OF INVENTION

This invention relates to a resistance heated vaporization vessel for the vacuum vaporization of metals and more particularly to a vaporization vessel composed of a graphite body with a pyrolytic boron nitride coating.

BACKGROUND OF THE INVENTION

Vacuum deposition is a common method for coating metals such as aluminum, copper, zinc, and tin onto various substrates of metal, glass and plastic. The metal is vaporized in a vessel commonly referred to as a "vaporization boat" by electric resistance heating. The vessel is connected to a source of electrical power to heat the vessel to a temperature which will cause the metal charge in contact with the boat to vaporize. Usually, the metal is vaporized in an evacuated chamber in which the product to be coated is placed. The product may be individually introduced into the evacuated chamber, or continuously fed through the chamber or, alternatively, may form part of the chamber itself. A wide variety of product is coated with metal using vapor deposition including ,e.g., television picture tubes, automobile headlights, toys and the like, The metal charge is placed into a recessed cavity machined into the top surface of the vessel. Upon reaching the vaporization temperature of the metal the metal charge melts and quickly vaporizes. The charge flashes in a vigorous and abrupt manner and the process is repeated with a new charge of metal. The number of flashes which can be performed in a given time period controls product production. Accordingly, the number of flashes a vessel can sustain without failure is a critical performance characteristic of the process. Conversely, when failure occurs the parts being coated are scrapped or have to be redone which involves additional time and cost. To avoid this extra cost the vessel may be scrapped before its anticipated failure. Short life vaporization vessels increase production costs per part and reduce efficiency.

SUMMARY OF THE INVENTION

Upon studying the modes of failure of a vaporization boat composed of a ceramic composite and particularly a vessel having a pyrolytic boron nitride surface coating it has been discovered, in accordance with the present invention, that the geometry of the cavity containing the metal charge and particularly the lateral cross sectional geometry of the cavity at the intersection with the top surface of the vessel can substantially affect the useful life of the vessel. It has been discovered in accordance with the present invention that the useful life of the vessel can be improved by modifying the cross sectional geometry of the cavity at the intersection with the top surface of the vessel so that it is less square and preferably so that it forms an included angle with the top surface of greater than 90 degrees.

The vaporization vessel of the present invention comprises: a body of substantially rectangular configuration having an upper relatively flat surface and a recessed cavity formed in the body with said cavity having a lateral cross sectional geometry which forms an included angle at the intersection with said substantially flat upper surface of greater than 90 degrees.

BRIEF DESCRIPTION OF THE DRAWINGS

Other advantages of the present invention will become apparent from the following detailed description of the invention when read in conjunction with the accompanying drawings of which.

DETAILED DESCRIPTION OF THE INVENTION

Figure 1:
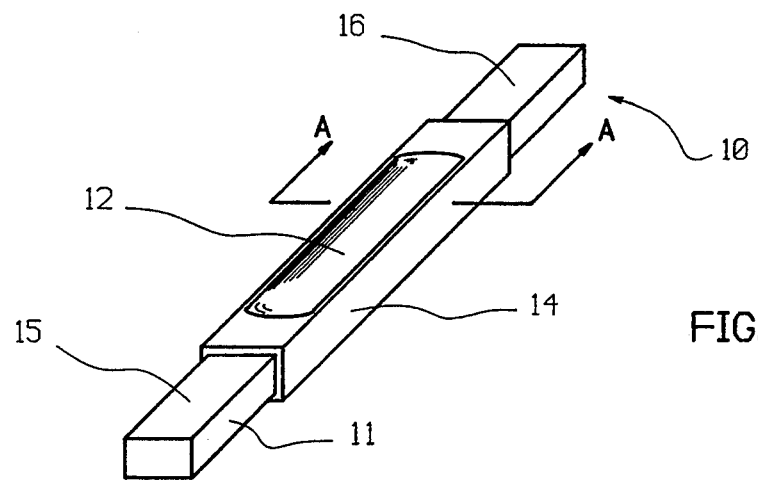
FIG. 1 is an isometric view of a typical vaporization vessel for use in a vacuum metallization process.

Resistance heated vaporization boats in use today require a precise shape to match the resistance circuit. They are made long and narrow with the length and cross sectional dimensions used to determine the electrical resistance of the vessel. A vaporization vessel 10 according to the present invention is composed of a graphite body 11 and a recessed cavity 12 with a coating 14 of pyrolytic boron nitride. Pyrolytic boron nitride can be produced by various methods such as, for example, the method disclosed in U.S. Pat. No. 3,152,006 in which pryrolytic boron nitride is deposited as a coating upon a substrate by the vapor phase reaction of ammonia and a boron halide such as boron trichloride. The coating 14 of boron nitride, which is usually no thicker than 0.030 inches, fully encapsulates the graphite body except for the ends 15 and 16 where the coating is machined off to expose the graphite for making an electrical connection with a clamp assembly which is used to connect the vessel 10 to a source of electrical power.

Figure 2:
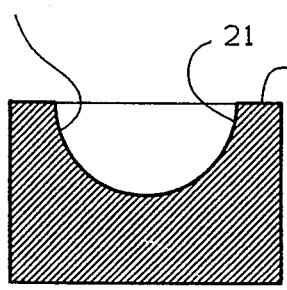
FIG. 2 is a lateral cross section taken along the lines 2—2 of FIG. 1 showing the prior art cross sectional geometry of the vessel.

Presently the graphite body 11 is preformed from a graphite block into a desired shape of preferably rectangular configuration. The recessed cavity 12 is machined into the body 11 for forming relatively upright side walls 18 in lateral cross section as shown in FIG. 2 with the longitudinal ends of the cavity 12 preferably of hemispherical geometry. The upright walls 18 form a generally square corner or edge 21 at the intersection with the top surface 20 of the vaporization vessel 10. This substantially squared off edge 21 is believed to contribute to a thermal problem which permits residual metal to collect at the edge 21. The collection of residual metal is believed to accelerate the destruction of the vessel from repeated flashing. The substantially square edge geometry 21 permits a colder band to form along the top surface 20 where it meets the edge 21 relative to the temperature along the inside lateral walls 18 of the cavity 12 which, in turn, permits impurities in the vaporized metal to collect along the edge 21. An aluminum charge, for example, will evaporate when the temperature of the aluminum is above its evaporation point. Other metal impurities also evaporate but at different rates. When these other metal impurities, such as iron, nickle and cobalt are more difficult to evaporate they will tend to condense on a colder surface from which they can run back down into the cavity 12 and attack the pryrolytic boron nitride coating 14.

Figure 3:
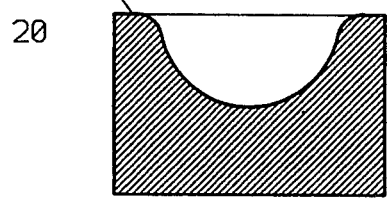
FIG. 3 is a cross sectional view of the vessel in accordance with the present invention with the intersecting corner between the cavity and the top surface rounded off.
Figure 4:
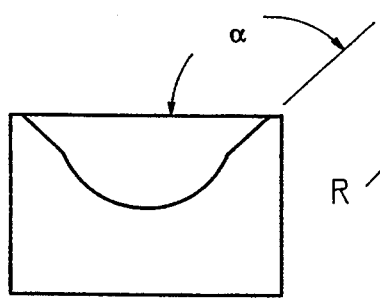
FIG. 4 is a enlarged cross sectional view of the vessel of the present invention formed with a chamfered edge along the top surface of the vessel at the intersection with the cavity.
Figure 5:
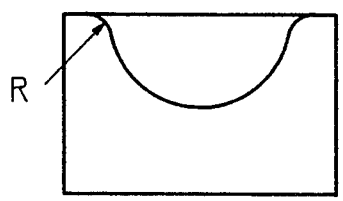
FIG. 5 is an enlarged cross sectional view of the vessel of the present invention formed with a fillet at the intersection of the cavity and the top surface of the vessel.
Figure 6:
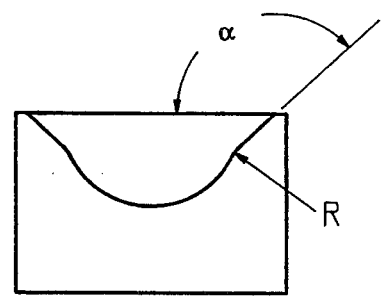
FIG. 6 is another enlarged cross sectional view of the vessel of the present invention formed with a combination of a chamfer and fillet to form a smooth transition at the intersection between the cavity and the top surface of the vessel.

In accordance with the present invention the cross sectional shape of the cavity at the intersection with the top surface 20 is changed from essentially a square corner as shown in FIG. 2 to one having either a rounded surface as shown in FIG. 3 with a fillet radius R as shown in FIG. 5 or having a chamfer as shown in FIG. 4 or a combination of a fillet radius and a chamfer as shown in FIG. 6. In theory any geometry which smooths the corner to enlarge the included angle a between the side walls 18 and the top surface 20 to over 90 degrees, and preferably over 120 degrees, would minimize the thermal impact and increase the useful life of the vessel 10.

What we claim is:

1. A vaporization vessel for use in the evaporation of a metal charge comprising: a body having a generally rectangular geometry with a substantially flat upper surface and a recessed cavity extending into said body from said substantially flat upper surface, said cavity having a lateral cross sectional geometry with lateral walls which form an included angle with said substantially flat upper surface of above at least 120 degrees.

2. A vaporization vessel as defined in claim 1 wherein a chamfer is formed at said intersection between said cavity and the upper surface of said body.

3. A vaporization boat as defined in claim 2 wherein said chamfer forms an included angle of 135 degrees.

4. A vaporization boat as defined in claim 1 wherein said intersection between said cavity and the upper surface of said body comprises a rounded curvature.

5. A vaporization boat as defined in claim 4 wherein said rounded curvature is formed using a rounded fillet.

6. A vaporization boat as defined in claim 4 wherein said intersection comprises a geometry including a chamfer and a fillet.

7. A vaporization boat as defined in claim 6 wherein said fillet intersects with the upper surface of said body to form an included angle of 45 degrees.

* * * * *